(12) United States Patent
Plangger et al.

(10) Patent No.: US 6,218,201 B1
(45) Date of Patent: *Apr. 17, 2001

(54) METHOD OF MANUFACTURING A LIQUID CRYSTAL DISPLAY MODULE CAPABLE OF PERFORMING A SELF-TEST

(75) Inventors: Guido Plangger, Eschenbach; Paul G. M. Gradenwitz, Zürich; Beat Huber, Adeiswil, all of (CH)

(73) Assignee: U.S. Philips Corporation, New York, NY (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/013,548

(22) Filed: Jan. 26, 1998

(30) Foreign Application Priority Data

Jan. 27, 1997 (EP) .................................................. 97200213
Apr. 21, 1997 (EP) .................................................. 97201157

(51) Int. Cl.[7] .................................................. G01R 31/26
(52) U.S. Cl. ............................ 438/15; 324/532; 324/770; 349/187; 438/17
(58) Field of Search ............................... 438/15; 324/532, 324/770

(56) References Cited

U.S. PATENT DOCUMENTS

| 5,056,094 | * | 10/1991 | Whetsel | 714/736 |
| 5,068,604 | | 11/1991 | Van de Lagemaat | 324/158 |
| 5,235,272 | * | 8/1993 | Henley | 324/158 |
| 5,375,003 | | 12/1994 | Hirai | 359/88 |
| 5,453,991 | * | 9/1995 | Suzuki et al. | 371/22.1 |
| 5,465,053 | * | 11/1995 | Edwards | 324/770 |
| 5,546,013 | * | 8/1996 | Ichioka et al. | 324/770 |
| 5,550,841 | * | 8/1996 | O'Brien | 371/22.1 |
| 5,631,567 | * | 5/1997 | Sporck et al. | 324/617 |
| 5,748,497 | * | 5/1998 | Scott et al. | 702/181 |
| 5,923,676 | * | 7/1999 | Sunter et al. | 714/733 |

* cited by examiner

Primary Examiner—John F. Niebling
Assistant Examiner—Jonathan Hack
(74) Attorney, Agent, or Firm—F. Brice Faller

(57) ABSTRACT

Method of manufacturing the quality of contacts e.g. in an LCD module in which an IC is so placed on the surface of a substrate that the external connections of the IC electrically contact the desired interconnections on the substrate.

The quality of the electrical contacts is tested by powering up the IC and running a selftest program. This selftest checks all contacts between the external connections of the device and the interconnections on the substrate, e.g. the row-column conductors on the LCD-glass. Due to a possibly poor ohmic contact the signals from the driver-IC may be delayed, the delay measured being representative for the quality of the contact.

8 Claims, 4 Drawing Sheets

METHOD OF MANUFACTURING A LIQUID CRYSTAL DISPLAY MODULE CAPABLE OF PERFORMING A SELF-TEST

The invention relates to an electronic device comprising at least one substrate, in which method an IC is placed on a surface of the substrate, which IC has a plurality of external connections which are brought into contact with interconnections on the surface during placement of the IC. The method is applied in particular to opto-electrical devices such as LCDs.

Currently used LCD drivers are typically devices with a high pin count (>100, 200 . . . ). During assembly, these devices have to be connected to interconnections on the LCD-display-glass or substrate or to a further substrate such as for example a printed-circuit board. There are various assembly methods, for example:

Chip-on-glass (COG), in which a device with gold-bumps is glued face to face onto the substrate (for example the LCD-glass), the gold bumps making contact to the interconnections, Tape-automated bonding (TAB), in which a device with gold-bumps is first soldered onto a film, after which this film is connected to the substrate (LCD-glass), providing electrical contacts between the gold-bumps and the interconnections, Standard bonding with gold-wiring into a plastic package which is then connected to the interconnections.

The method chosen has a direct impact on the costs of an LCD-module (module=substrates, including driver-IC). The COG application requires a minimal number of assembly steps because only a single contact between each driver output and an interconnection to the LCD input (or more generally between each external connection of the IC and an interconnection on the surface of the substrate) has to be made. However, such a COG assembly has some drawbacks:

Different causes may lead to a poor contact such as misalignment between gold-bumps and interconnections, contamination between gold-bumps and interconnections, and insufficient pressure during gluing.

Furthermore the height of the gold-bumps may vary to some extent within a chip. Consequently, there may be a gap between the bumps and the interconnections on the LCD-glass, which results in a poor contact.

To cope with this, the following assembly process may be carried out:

The driver-IC is first pressed onto the LCD-glass (or substrate) and then powered up.

The correct contacts between bumps and interconnections on the LCD-glass are then observed by sending some data to the LCD-display (for example, all pixels switched on and off).

If the display on the LCD-glass shows no defect, then the glue between driver-IC and glass is hardened.

This is a relatively slow process which requires some pattern-recognition hardware. Nevertheless, the quality of the contact between the bump and the interconnection cannot be measured (it is just a GO/NO-GO result). This assembly process thus has a rather low yield (number of approved LCD-modules, divided by the number of assembled LCD-modules).

Due to the demand for larger LCD-displays (requiring more interconnections), the pitch between bumps must be reduced from the current 100 $\mu$m. From the side of the LCD-glass processing, interconnections with a pitch of 30 $\mu$m are already possible. Such a small pitch would have a further impact on the yield of the assembly process, because the allowable misalignment between gold-bumps and interconnections is restricted further.

OBJECTS AND SUMMARY OF THE INVENTION

It is an object of the invention to provide a method of manufacturing an electronic device such as an LCD module which allows readout of the quality of the contacts and possibly a fully automated assembly (if desired, but not necessarily, combined with pattern recognition). This should not be in the form of GO/NO-GO results, but allow measurement of the margin between the quality of the actual contacts, and the quality of the contacts as defined in its specification.

According to the invention, the above object is met in that the quality of the connections is tested by powering up the IC (the chip) and running a selftest program after placement of the chip on the substrate.

The invention is based on the idea of using the functionality of the chip to test the quality of the connections during assembly or at a later stage. This could be done, for example, by using the built-in capacitance of an LCD-device to reroute some output signals (for example, from the row pads) to some other pads (for example, the column pads).

comparing the delay of a rerouted signal with the external frequency, and calculating, as effect, a GO/NO-GO result, or by, an extra device introducing a delay, for example by a capacitance and reroute signals from external connections of the IC to other external connections, comparing the delay of a rerouted signal with a predetermined delay.

BRIEF DESCRIPTION OF THE DRAWINGS

The above embodiments, as well as various other objects, features and attendant advantages of the present invention will be more fully appreciated when considered in conjunction with the accompanying drawings, in which like reference characters designate the same or similar parts throughout the several views, and in which.

DESCRIPTION OF THE PREFERRED EMBODIMENTS

Figure 1:
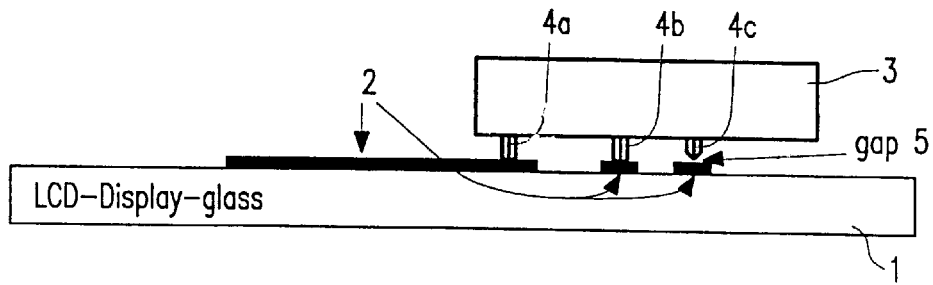
FIG. 1 illustrates a side view of a cross section through an LCD-glass plate on which a driver-IC is arranged.

FIG. 1 shows an LCD-substrate (glass, quartz, plastic) 1 provided with interconnections 2. A driver-IC 3 provided with (gold) bumps 4a, 4b, 4c is arranged on the plate 1 so that the bumps contact the interconnections. In a specific case there may be a bad contact, or even no contact at all, as indicated by gap 5.

The main concept of the invention is to measure the delay by which a signal from the driver IC 3 is delayed, when it is sent to the LCD-glass 1. The main component of this delay is an RC-delay in which R=(contact resistance (ohm) at the contact)+(resistance of conductors (7,8))+(output resistance of the driver IC)

C=capacitance (Farad) of the interconnection at conductors (7,8) and the LC-element.

Figure 2:
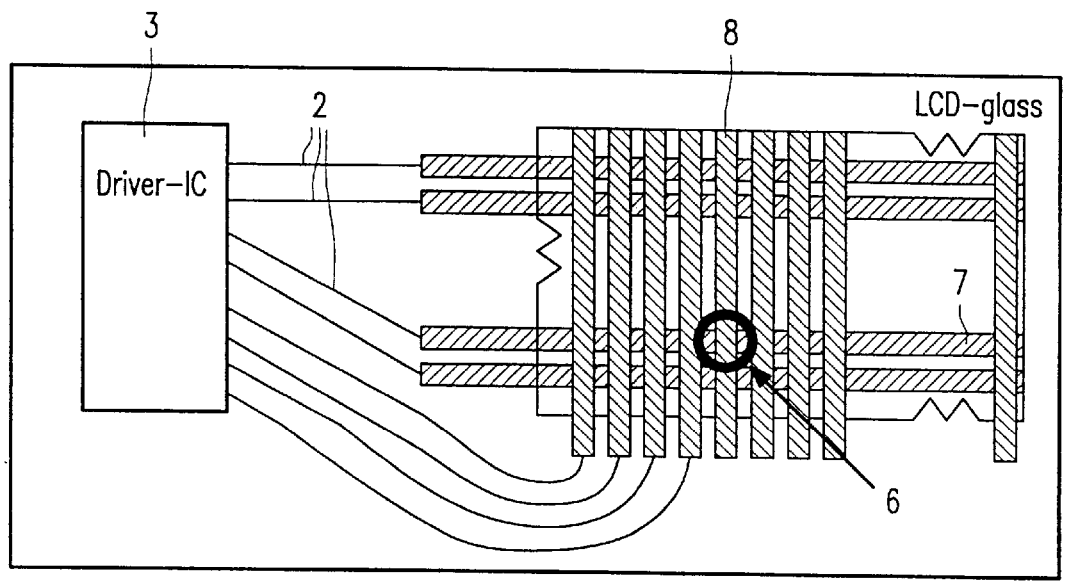
FIG. 2 shows a schematic top-view of an LCD-driver IC assembly.
Figure 3:
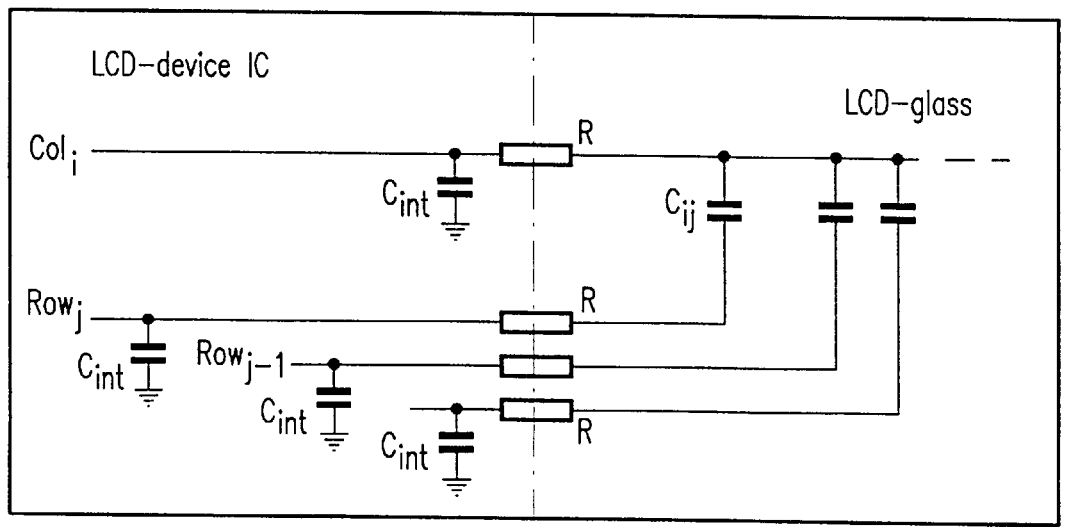
FIG. 3 shows an electrical connection diagram for a part of the assembly of FIG. 2.

As is shown in FIG. 2, a complete LCD display comprises a plurality of pixels 6 which can be switched on (dark) or off (clear) independently. Physically, each of these pixels 6 is defined by a crossing of a column and a row conductor 7, 8 . . . . The columns are isolated from the rows by means of the LCD-liquid. Together, they form a capacitance. The electrical connection diagram for a single column i is shown in FIG. 3.

Figure 4:
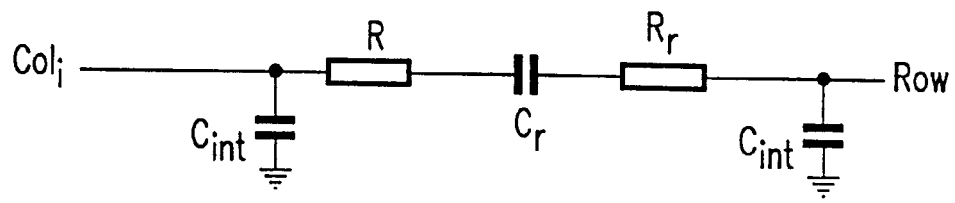
FIG. 4 shows a simplified version of the diagram of FIG. 3.

If we take that the potentials at all rows are identical, and that the potentials at all columns are identical, the diagram can be redrawn as shown in FIG. 4.

The capacitance $C_r$ (=Σ $C_j$) is determined by the LCD-glass layout used and shows values of typically 200–600 pF. The internal capacitance $C_{int}$ per pin of the LCD driver IC 3 is typically 1–10 pF. The main point of focus of the invention is the contact resistance R. The better the quality of the assembly, the lower this resistance R.

In the application, the LCD driver IC creates waveforms which are sent to column and row pins (bumps 4). Via contact with the conductors (interconnections 2) on the LCD-glass, these waveforms then arrive at the pixels. The contact resistance R and the LCD-capacitance $C_r$ influence the delay between the internal waveform, and the waveform at the pixels. The quality of the contact can thus be controlled by monitoring a delay comprising this component $RC_r$. A good quality of the contact is achieved if the period P of the waveform is larger than the $RC_r$ delay: $P>>RC_r$. By measuring the $RC_r$ delay itself (or a delay comprising $RC_r$), it can be guaranteed that the contact for the actual application has an optimal quality.

This test can be done before or after fixing the contact of the external connections 4 to the interconnections 2 on the substrate.

The device should be powered up during the test (for example, during assembly). Moreover, it must be possible for the device to be brought to a special test-mode in which the device starts a selftest (as described hereinafter). This is done by using an additional test pin, or by driving the standard input pins to an unusual (forbidden) combination.

A clock (frequency) is also needed in the device to compare the ($RC_r$) delay with the period of a reference clock-frequency. If the device does not have an internal clock generator, an external clock must be supplied. An external clock is necessary if simple GO/NO-GO information is not enough, and the contact should somehow have an 'analog' quality. In such a case, the frequency of this external clock (at which the response of the device changes from GO to NO-GO) is the indication of the contact quality.

To allow such a measurement, some hardware is needed on the LCD-driver IC:

a finite state machine (this is a common expression for certain digital logic circuitry, using stored states in flipflops and gates), for sending a predefined stream of pulses to rows (or columns). The influence of these pulses can be observed (via capacitance $C_r$) at the strobed potential gauge at the column (or row) pins:

a strobed potential gauge per column and row pin.

A logic OR of all column pins can be interpreted as follows: At least one column pin is not at ground potential.

A logic AND of all column pins can be interpreted as follows: At least one column pin is at ground potential.

Figure 5:
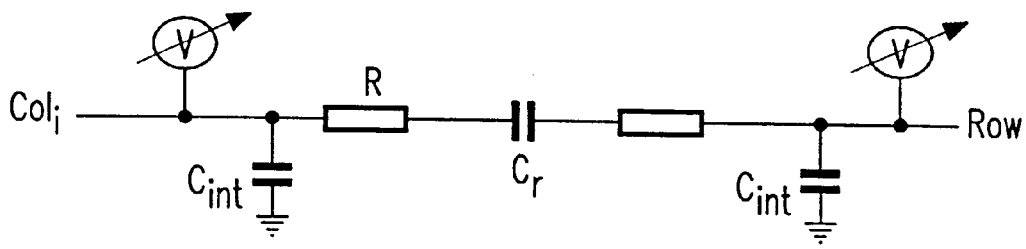
FIG. 5 shows the diagram of FIG. 4 in a selftest mode.

A similar row-OR and row-AND signal is needed for the row pins. See the diagram in FIG. 5.

These signals are not observed continuously, but clocked into a flipflop with a specified clock period. This period can be defined externally (external frequency applied), or if available, an internal oscillator can be used. As a consequence, this period is compared with the actual $RC_r$ delay:

The following part of a sequence of steps is possible:
1. connect all columns to 3 Volt and all rows to 5 Volt (precharge the capacitance $C_{int}$ and define a voltage at $C_r$)
2. disconnect the column pins (the voltage should remain at column pins due to the $C_{int}$ capacitance)
3. connect the rows to 2 Volt, (all columns should be at 0 Volt now due to capacitance $C_r$)
4. strobe the column-OR signal after at least 1 period (logic '0'=pass):
5. The OR and AND over all column and row pins, respectively, can be simple pull-up-ORs or pull-down-ANDs, as the current consumption during this test is of no importance.

The measurement of the RC, delay is calibrated by means of the clock frequency: the slower the clock frequency, the more time is available for the device to settle the potentials at the pins, before the result is strobed into the flipflops (and from there presented).

A similar pulse sequence can be used for the short-circuit test between two neighbouring pins. In this case, there is some additional hardware needed to treat any second pin differently.

A standard feature of LCD-devices already includes the hardware to drive the column and row pins to GROUND, VDD or another voltage, or to disconnect these pins completely. Moreover, these devices typically allow an external clock to be used (besides the internally generated clock). Therefore, only the following items are required:

wiring lines along the pads for the OR and AND signals a finite state machine, to create the sequence of pulses possibly another testpad, to allow a simple entry to this special testmode.

This application is intended particularly, but not exclusively, for the assembly of COG modules and for the test of fully assembled LCD-modules (final test of any assembly form).

Figure 6:
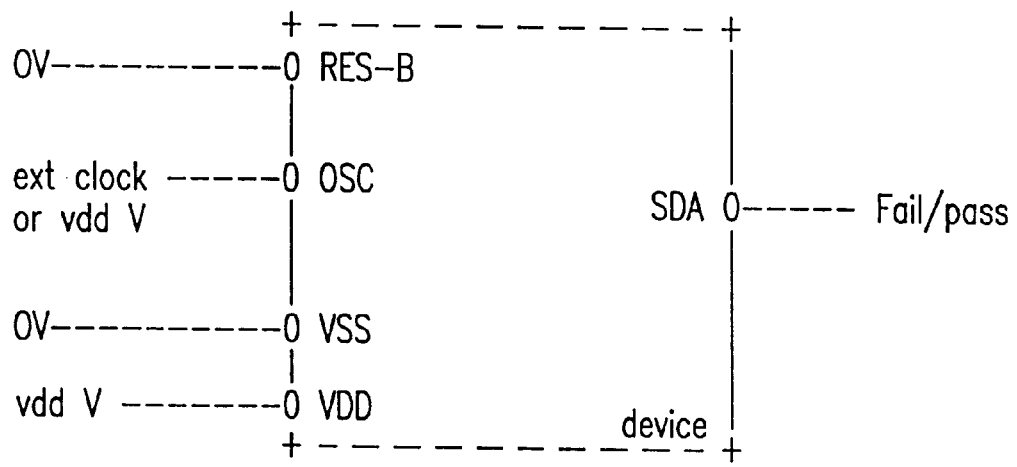
FIG. 6 schematically shows driver-IC output connections enabling a selftest-check.

Description of embodiment with reference to FIG. 6.

The device provides a selftest during assembly (chip-on-glass) or at a later stage in the application (COG, TAB, . . . , any assembly form).

This selftest checks all contacts between the outputs of the IC device and the row-column conductors 7, 8 on the LCD-glass. Due to a possibly poor ohmic contact, the signals from the device may be delayed, which results in an incorrect display of the LCD-pixels. Such a poor ohmic contact is recognized in this selftest.

The limits for the allowed resistivity of such a contact depend on the clock frequency of the signals. The device calculates the Fail/Pass result of the selftest in accordance with the actual clock frequency. This frequency depends on the application and is either internally generated on the device, or externally supplied.

The selftest is started (during assembly or in the application) if the RES-B pin (reset pin) is driven to VSS voltage or via an external command (loaded via standard input/output interface) to the LCD-driver, in which case no reset pin is needed.

a command at the OSC pin (oscillator pin) starts the internal clock. The device may be supplied with an external clock frequency. If an external clock frequency is not available, or cannot be used for other reasons, the OSC pin is not needed.

The result of the selftest is shown on pin SDA as a logic 1 (Pass) or as a logic 0 (Fail). This result is recalculated continuously (typically once per msec). The output of the test can also be read out from the LCD-driver by means of a standard input/output interface (no SDA-pin is needed in that case).

The selftest is stopped by driving the RES-B pin to VDD voltage, or by an external command.

further (measuring) device required:

In the case of a selftest during assembly, the following devices are required:
power supply to drive the VSS (and RES-B) pin to 0V and VSS and the OSC-pin
optionally, any display unit such as a LED or voltage measurement unit, to check the signal on pin SDA (Fail/Pass status of the selftest).
optionally, a frequency generator may be connected to the OSC-pin, to use an external frequency instead of the internal frequency. This is necessary if more information is needed on the quality of the contacts: it allows measurement of the margin between the clock frequency in the application and the critical clock frequency, where the contacts are not in accordance with the specification.

In the case of a selftest during the application, no additional devices are required, because the commanding microprocessor (which is available in all applications) has full control of these input and output pins.

In principle, the invention does not change anything in the shape or the interface of the driver IC. Only some logic is added on the chip. This will probably increase the IC area by a few percent, compared with an IC which is designed without this feature. No additional pins are needed. Especially the pads (or bumps) where the device can be contacted are identical.

It is to be noted that the invention concerns not only driver ICs with bumps, but allows any interconnection:

There may be any number of interconnections (serial) between the driver IC and the LCD substrate. The technology described with bumps is only an example (having just one interconnection between an output of the driver IC and the input of the substrate).

Examples with more interconnections are:

driver IC on film: there is a first interconnection between the driver IC and conductors of the film and another interconnection between the conductors of the film and the LCD-substrate.

or chip-on-board: The driver IC is placed on a PCB (printed circuit board), and the wiring (on this PCB) is connected to a substrate of the LCD.

Figure 7:
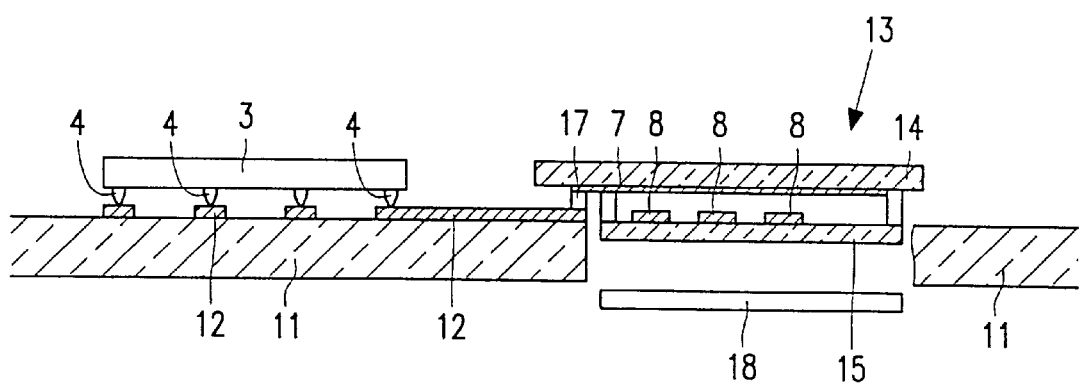
FIG. 7 illustrates a cross section of another assembly.
Figure 8:
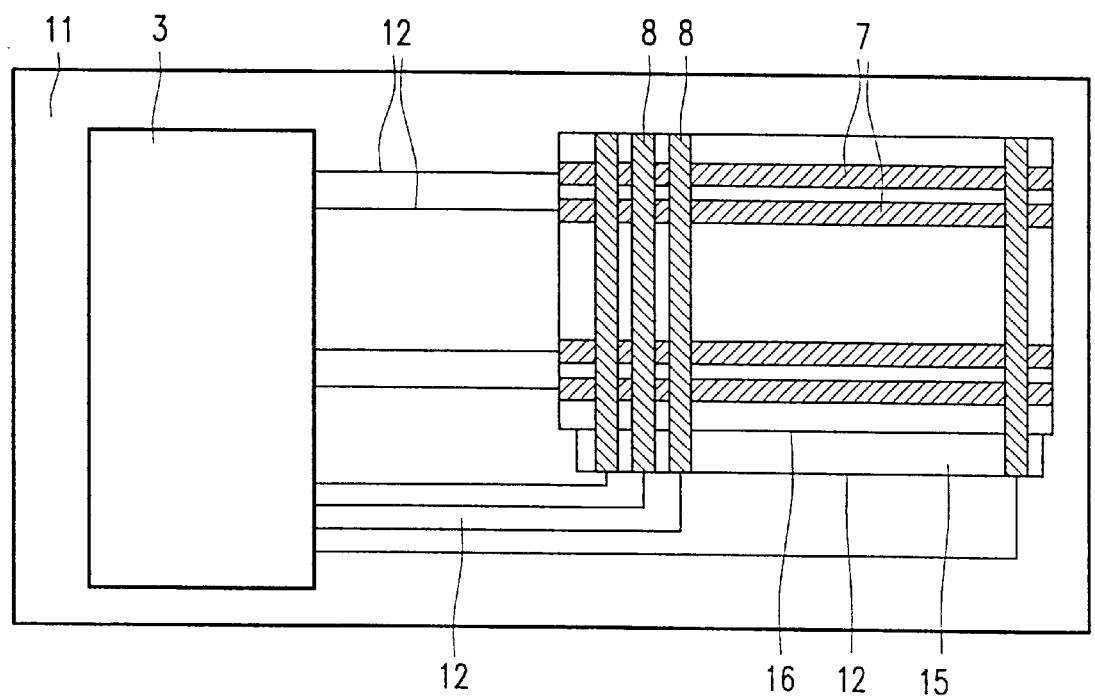
FIG. 8 shows a schematic top-view of the assembly of FIG. 7.

An example of such a device is shown in FIGS. 7, 8. A driver IC 3 is placed on a substrate 11, in this case a printed circuit board (but also a flexible film is possible). The IC is provided with (gold-)bumps 4 so that the bumps contact interconnections 12 on the surface of substrate 11. The device comprises an LCD-cell 13 having a first substrate 14 provided with row conductors 7 and a second substrate 15 provided with column conductors 8. Column conductors 8 are connected to conductive strips 8' on substrate 14 by means of, for example, anisotropic conductors at the edge 16 of substrate 14. All conductors 7, 8' are interconnected to interconnections 12 by a connector 17. The device also has a schematically shown backlight 18.

A distinct route between a first connection 4 and a second connection 4 now comprises, apart from the interconnections 12 on the substrate 11, extra elements (the LCD-cell 13, the connector 17 and the anisotropic conductors (not shown)). In the diagrams of FIGS. 3 and 4 only extra resistors for the connector 17 and the anisotropic conductors have to be added. This implies that a similar self-test as described above with regard to FIGS. 1, 2 can be applied to the device of FIGS. 7, 8.

If necessary the LCD device 13 can be removed after testing and be used to test the quality of the contacts between bumps 4 and interconnections 12 of other substrates (PCBs) 11.

The method allows a test of the whole system of interconnections between the driver IC and the LCD substrate. However, it can be executed only at one of the last manufacturing steps for this system or at a later stage:

for example: If a driver IC with bumps is connected directly to the substrate, then the test may already be run during this manufacturing step (when the driver IC touches the substrate), or at any later stage (in the final application).

but: If the driver IC is first connected to a film, and if this film is then connected to the substrate in a later process, then the test may be run only during this later process (film is connected to the substrate) or at any later stage (in the final application).

The following should be noted with reference to the words 'column' and rows' used throughout this application:

Each display pixel of an LCD display is mainly a capacitor with two connections (one on the upper glass, and one on the lower glass), with the liquid in between.

The connections on one of these 2 glasses are typically called 'column' or 'segment', whereas the connections on the other glass are typically called 'row' or 'backplane'.

The method implies that a wave signal is sent via the connections on one of the two glasses, and the response is then verified via the connections on the other glass (or more generally via the connections of the capacitor).

The following should be noted with reference to the physical implementation:

A waveform with logic '0's and '1's is created by means of an FSM (finite state machine). This waveform is sent to the column (or row) pins. The time between two such transitions (from '0' to '1', or back from '1' to '0') is defined via the clock frequency in the driver IC, as the register (flipflops) in the FSM is clocked with this clock frequency).

The response (delayed signal) is then buffered (converted back to logic 1 or 0). With a simple logic, a result (Fail or Pass) is calculated via FSM.

It is important that this result is read into a register (flipflop) at the next clock-edge. This means that the delay (to be measured) must not be longer than one clock cycle. If the delay is too long, the calculated result will still give a "Fail", and this 'Fail' is then clocked into the register. The value of this register is shown at the output of the device.

If an external clock frequency is fed into the driver IC, it will be possible to measure the real delay by adjusting the frequency until a Fail - ->Pass transition is detected.

Figure 9:
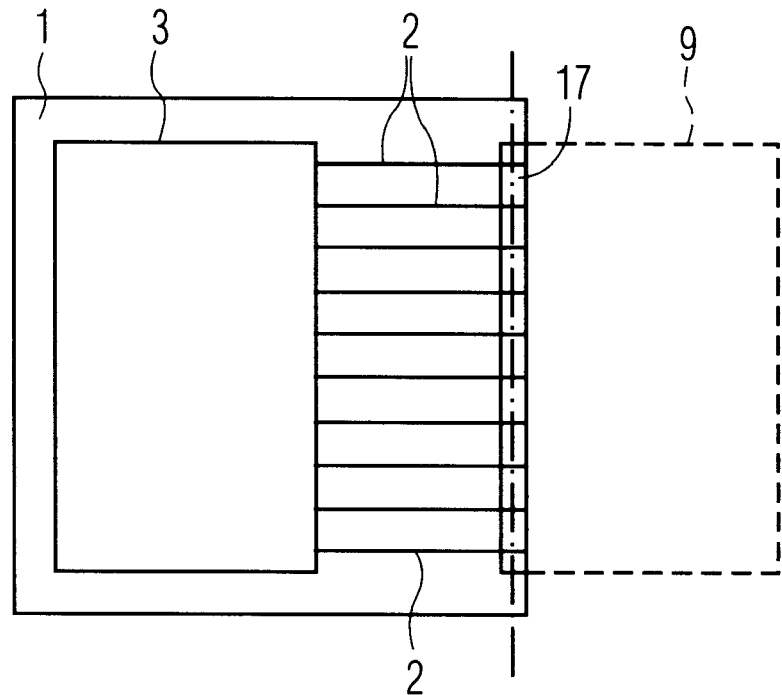
FIG. 9 and FIG. 9A show another embodiment of the invention.
Figure 9A:
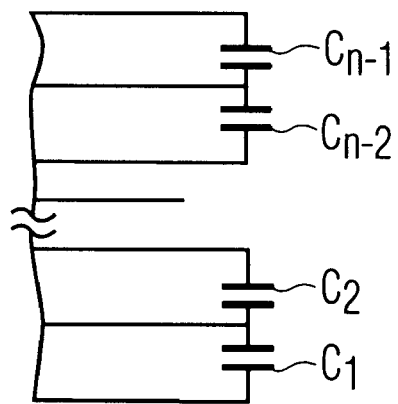

FIG. 9 shows a device in which the quality of contacts on substrates (PCB1) is tested. An IC 3 is placed on a substrate 1 having interconnections 2 which are connected to a connector 17. Via this connector 17 the interconnections 2 are interconnected during testing to routes on an extra device 9. The device 9, shown in FIG. 9A has routes including capacitors C, so a similar diagram as shown in FIG. 3 can be drawn. By adding some logic on the chip (IC) pins are made fit for producing and receiving waveforms (test signals) so the quality of contacts can be tested by the self-test as described. Even if only the quality of the contacts of a few pins can be tested this is generally a good indication for the quality of all contacts. Examples of chips to be tested in this way are memory drivers.

The routings on the extra device 9 and the values of capacitors $C_1 \ldots C_{n-1}$ (FIG. 9a), between n interconnections 2 in this device are chosen, dependent on the functional behaviour of IC 3. After testing the extra device 9 is removed.

The final fixing of the contacts of the IC to the interconnections 2 may be performed both before and after the testing.

There has thus been shown and described a novel method of manufacturing a liquid crystal display module capable of performing a self-test which fulfills all the objects and advantages sought therefor. Many changes, modifications, variations and other uses and applications of the subject invention will, however, become apparent to those skilled in the art after considering this specification and the accompanying drawings which disclose the preferred embodiments thereof. All such changes, modifications, variations and other uses and applications which do not depart from the spirit and scope of the invention are deemed to be covered by the invention, which is to be limited only by the claims which follow.

What is claimed is:

1. In a method of manufacturing an electronic display module comprising at least one substrate having a surface with a plurality of interconnections thereon for controlling the module, in which method an IC is placed on the surface of the substrate, which IC has plurality of external connections that are brought into contact with the interconnections on the surface during placement of the IC, the IC being operative, in a display driver mode, for producing control signals at the interconnections for operating the module to create a display, the improvement wherein, after the placement, the IC is operated in a self-test mode for producing test signals at distinct first interconnections, which test signals, after having followed a distinct route, are received at distinct second interconnections, the delay of a received signal being compared within the IC with a predetermined delay, whereby the delay of the received signal at said second interconnections is a quality measure for contact resistances between the interconnections on the substrate and the external connections of the IC.

2. A method as claimed in claim 1, characterized in that the device comprises a further substrate, the substrates enclosing an electro-optical medium, and in that the IC is a driver IC having external output connections, the IC being placed on the outer edge of one of the surfaces, in which the test mode test signals are produced at distinct first outputs and are received at distinct second outputs.

3. A method as claimed in claim 1, characterized in that the device comprises at least one extra device, the extra device comprising at least one element of the distinct route.

4. A method as claimed in claim 3 characterized in that the extra device comprises substrates enclosing an electro-optical medium, and in that the IC is a driver IC having external output connections, whereby in the test mode test signals are produced at distinct first outputs and are received at distinct second outputs.

5. A method as claimed in claim 1, wherein, in the test mode, the driver IC produces waveform signals.

6. A method as claimed in claim 2, wherein in the first outputs are connected to column conductors and the second outputs are connected to row conductors.

7. A method as claimed in claim 2, wherein the first outputs are connected to row conductors and the second outputs are connected to column conductors.

8. A method as claimed in claim 6, wherein the row and column conductors define pixels adjacent their crossings.

* * * * *